(12) United States Patent
Arslan et al.

(10) Patent No.: US 10,698,616 B2
(45) Date of Patent: Jun. 30, 2020

(54) EFFICIENT DATA STORAGE ACROSS MULTIPLE STORAGE VOLUMES EACH REPRESENTING A TRACK OF A LARGER STORAGE VOLUME

(71) Applicant: Quantum Corporation, San Jose, CA (US)

(72) Inventors: Suayb S. Arslan, Irvine, CA (US); Turguy Goker, Vista, CA (US); Jaewook Lee, Aliso Viejo, CA (US)

(73) Assignee: Quantum Corporation, San Jose, CA (US)

( * ) Notice: Subject to any disclaimer, the term of this patent is extended or adjusted under 35 U.S.C. 154(b) by 0 days.

(21) Appl. No.: 15/352,475

(22) Filed: Nov. 15, 2016

(65) Prior Publication Data

US 2018/0136857 A1    May 17, 2018

(51) Int. Cl.
*G06F 3/06* (2006.01)
*G06F 13/42* (2006.01)
*G06F 11/10* (2006.01)
*H03M 13/15* (2006.01)
*H03M 13/27* (2006.01)

(52) U.S. Cl.
CPC .......... *G06F 3/0619* (2013.01); *G06F 3/0659* (2013.01); *G06F 3/0689* (2013.01); *G06F 11/1076* (2013.01); *G06F 13/4282* (2013.01); *G06F 2213/0032* (2013.01); *H03M 13/1515* (2013.01); *H03M 13/27* (2013.01)

(58) Field of Classification Search
CPC .... G06F 3/0601; G06F 3/0619; G06F 3/0626; G06F 3/064; G06F 3/0643; G06F 3/0644; G06F 3/0647; G06F 3/0668; G06F 3/067; G06F 3/0683; G06F 3/0689; G06F 11/1076; G06F 13/4282; G06F 2212/401; G06F 2212/402; G06F 2213/0032; H03M 13/1515; H03M 13/27
See application file for complete search history.

(56) References Cited

U.S. PATENT DOCUMENTS

| | | | | |
|---|---|---|---|---|
| 2008/0005384 | A1* | 1/2008 | Mead | G06F 13/28 710/22 |
| 2013/0282953 | A1* | 10/2013 | Orme | G06F 12/0238 711/102 |
| 2014/0344645 | A1* | 11/2014 | Gladwin | G06F 21/72 714/763 |
| 2016/0092305 | A1* | 3/2016 | Alam | G06F 11/1076 714/764 |
| 2017/0286223 | A1* | 10/2017 | Baptist | G06F 11/1076 |

\* cited by examiner

*Primary Examiner* — Justin R Knapp (57) ABSTRACT

Embodiments disclosed herein provide systems, methods, and computer readable media for storing data to a plurality of physical storage volumes. In a particular embodiment, a method provides identifying first data for storage on the plurality of physical storage volumes. Each of the plurality of storage volumes corresponds to respective ones of a plurality of data channels. The method further provides segmenting the first data into a plurality of data segments corresponding to respective ones of the plurality of data channels and transferring the plurality of data segments as respective bit streams over the respective ones of the plurality of data channels to the respective ones of the plurality of physical storage volumes. The plurality of storage volumes stores the respective bit streams in the exact condition in which the bit streams are received.

20 Claims, 6 Drawing Sheets

EFFICIENT DATA STORAGE ACROSS MULTIPLE STORAGE VOLUMES EACH REPRESENTING A TRACK OF A LARGER STORAGE VOLUME

TECHNICAL FIELD

Aspects of the disclosure are related to the storage of data and, in particular, to the storage of data across multiple storage volumes.

TECHNICAL BACKGROUND

Current large scale (for the most part) data storage systems use storage volumes, most commonly hard disk drives (HDDs), on a standalone basis. That is, when data is transferred to one of the storage volumes, that storage volume stores the data in the same manner it would if it were a volume on, for instance, a personal computer. Accordingly, to achieve more desirable performance characteristics, such as higher access rates, better error rates, and better failure protection, data storage systems resort to using technologies like redundant array of independent disks (RAID) to write data to multiple volumes simultaneously and add parities to data in order to increase the speed in which data is stored while being able to recover the data should one of the storage volumes fail or otherwise cause errors in the data. As the capacities of individual volumes increases, the possibility of encountering an unrecoverable error when attempting to access stored data increases. It therefore becomes more difficult to achieve desirable error rates while keeping monetary costs per gigabyte of data low using traditional methods of storing data across multiple storage volumes Overview Embodiments disclosed herein provide systems, methods, and computer readable media for storing data to a plurality of physical storage volumes. In a particular embodiment, a method provides identifying first data for storage on the plurality of physical storage volumes. Each of the plurality of storage volumes corresponds to respective ones of a plurality of data channels. The method further provides segmenting the first data into a plurality of data segments corresponding to respective ones of the plurality of data channels and transferring the plurality of data segments as respective bit streams over the respective ones of the plurality of data channels to the respective ones of the plurality of physical storage volumes. The plurality of storage volumes stores the respective bit streams in the exact condition in which the bit streams are received.

In some embodiments, the plurality of data segments comprises a plurality of files. In those embodiments, the method provides segmenting the first data comprises splitting the first data into a plurality of subsets and splitting each subset of the plurality of subsets into a plurality of code words contained in the plurality of files if error correcting code (ECC) is used for data protection.

In some embodiments, splitting each subset of the plurality of subsets into the plurality of code words comprises orthogonally distributing symbols from each subset of the plurality of subsets into the plurality of code words to form the plurality of files.

In some embodiments, the method provides individually protecting each code word of the plurality of code words using a C1 Reed-Solomon error-correcting code and interleaving the plurality of code words.

In some embodiments, the method provides encoding each code word of the plurality of code words using a C2 Reed-Solomon error-correcting code.

In some embodiments, the number of subsets in the plurality of subsets is equal to twice the number of data channels in the plurality of data channels.

In some embodiments, the method provides performing at least one of cyclic redundancy check (CRC), encryption, or compression on the first data.

In some embodiments, each of the plurality of channels comprises a Serial ATA (SATA) channel between the storage subsystem and one of the plurality of physical storage volumes.

In some embodiments, the plurality of physical storage volumes comprises a plurality of hard disk drives.

In some embodiments, each hard disk drive of the plurality of hard disk drives only writes control and timing bits in addition to writing the bit stream.

In another embodiment, a system is provided including one or more computer readable storage media and a processing system operatively coupled with the one or more computer readable storage media. Program instructions stored on the one or more computer readable storage media, when read and executed by the processing system, direct the processing system to identify first data for storage on the plurality of physical storage volumes. Each of the plurality of storage volumes corresponds to respective ones of a plurality of data channels. The program instructions further direct the processing system to segment the first data into a plurality of data segments corresponding to respective ones of the plurality of data channels and transfer the plurality of data segments as respective bit streams over the respective ones of the plurality of data channels to the respective ones of the plurality of physical storage volumes. The plurality of storage volumes stores the respective bit streams in the exact condition in which the bit streams are received.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

The following description and associated figures teach the best mode of the invention. For the purpose of teaching inventive principles, some conventional aspects of the best mode may be simplified or omitted. The following claims specify the scope of the invention. Note that some aspects of the best mode may not fall within the scope of the invention as specified by the claims. Thus, those skilled in the art will appreciate variations from the best mode that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
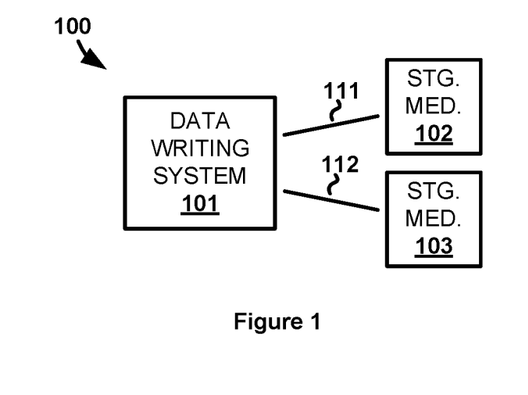
FIG. 1 illustrates a data storage environment for storing data to a plurality of physical storage volumes.

FIG. 1 illustrates data storage environment 100 for storing data across multiple physical data storage volumes. Data storage environment 100 includes data write system 101, data storage volume 102, and data storage volume 103. Data write system 101 and data storage volume 102 communicate over communication link 111. Data write system 101 and data storage volume 103 communicate over communication link 112.

In operation, data write system 101 provides a more efficient means of storing data across multiple data storage volumes. Data storage environment 100 only includes two physical data storage volumes 102 and 103 for simplicity, however, it should be understood that data storage environment may include any number of physical data storage volumes. The number of data storage volumes is only limited by the number of data channels available to the data write system 101.

Regardless of the number of physical data storage volumes employed, data write system 101 treats each respective storage volume as though the storage volume is a "track" of a single larger data storage volume (e.g., akin to a single magnetic data tape having tracks onto which data is stored). By treating the individual physical storage volumes as tracks of a larger storage volume, each physical storage volume need only write the bits received from data write system 101. All processing on the data is performed by data write system 101. The physical storage volumes do not need to perform any functions other than those necessary to write the data. For example, if the physical storage volumes are hard disk drives (HDDs), each HDD need only perform the functions necessary to store bits on the magnetic platters therein. No additional processing of the data, such as processing for error correction, is performed.

The fact that the physical storage volumes do not need to perform additional processing allows them to write data at, or at least close to, their maximum speed. Furthermore, the techniques used by data write system 101 to provide protection from errors and data volume failure are able to provide better results than relying on the methods used by each individual physical storage volume. Additionally, the manner in which data write system 101 processes data and interfaces with the physical storage volumes allows data write system 101 to be a more lightweight system than traditional data storage servers.

Figure 2:
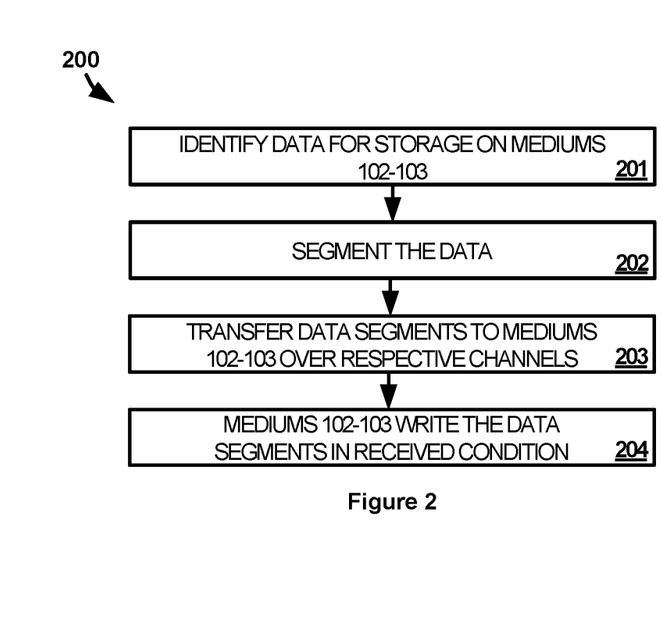
FIG. 2 illustrates a method of operating the data storage environment to store data to a plurality of physical storage volumes.

FIG. 2 illustrates method 200 of operating data storage environment 100 to store data across multiple physical data storage volumes. Method 200 provides data write system 101 identifying data for storage on physical data storage volumes 102 and 103 (201). As noted above, the number of physical data storage volumes is limited by the number of data channels, with each data channel corresponding to a respective one of the physical data storage volumes. As such, in data storage environment 100, communication links 111 and 112 correspond to data channels between data write system 101 and physical data storage volumes 102 and 103, respectfully. The data channels may be serial data channels, such as serial advanced technology attachment (SATA) channels, or may use some other type of data transport interface. The data to be stored may be identified by being received from another computing system, which may be coupled to data write system 101 over a communication network, may be identified from a user instruction into data write system 101, either directly into a user interface or via another computing system in communication with data write system 101, may be identified from data already stored within data write system 101, or may be identified in some other manner.

Method 200 then provides data write system 101 segmenting the data into data segments corresponding to respective ones of the data channels (202). Since each data channel corresponds to one of physical data storage volumes 102 and 103, the segments also correspond to respective ones of data storage volumes 102 and 103. Data write system 101 may separate the data into segments using any scheme, however, the data is preferably separated as part of processing to protect the data for the purposes of error correction or storage volume failure recovery. For example, data writing system may put the data through erasure coding in which the data is segmented, expanded, and encoded with redundant data pieces. The resultant segments are then divided among physical storage volumes 102 and 103.

Method 200 further provides data write system 101 transferring the data segments as respective bit streams over the respective data channels to the respective ones of physical storage volumes 102 and 103 (203). Physical storage volumes 102 and 103 then write the received bits in the exact condition in which the bit streams are received (204). By not having to further process the bits received from data write system 101, physical data storage volumes 102 and 103 can write the data much faster than if additional processing was required. In some cases, data write system 101 may be able to manage an internal buffer to ensure that data is not transferred to physical data storage volumes 102 and 103 faster than physical data storage volumes 102 and 103 can write that data. This eliminates the need for physical data storage volumes 102 and 103 to maintain an internal buffer of their own. Moreover, since physical data storage volumes 102 and 103 do not perform functions on the data outside of writing the received bits, the internal processing circuitry of physical data storage volumes 102 and 103 can be simplified from that typically contained therein.

Figure 3:
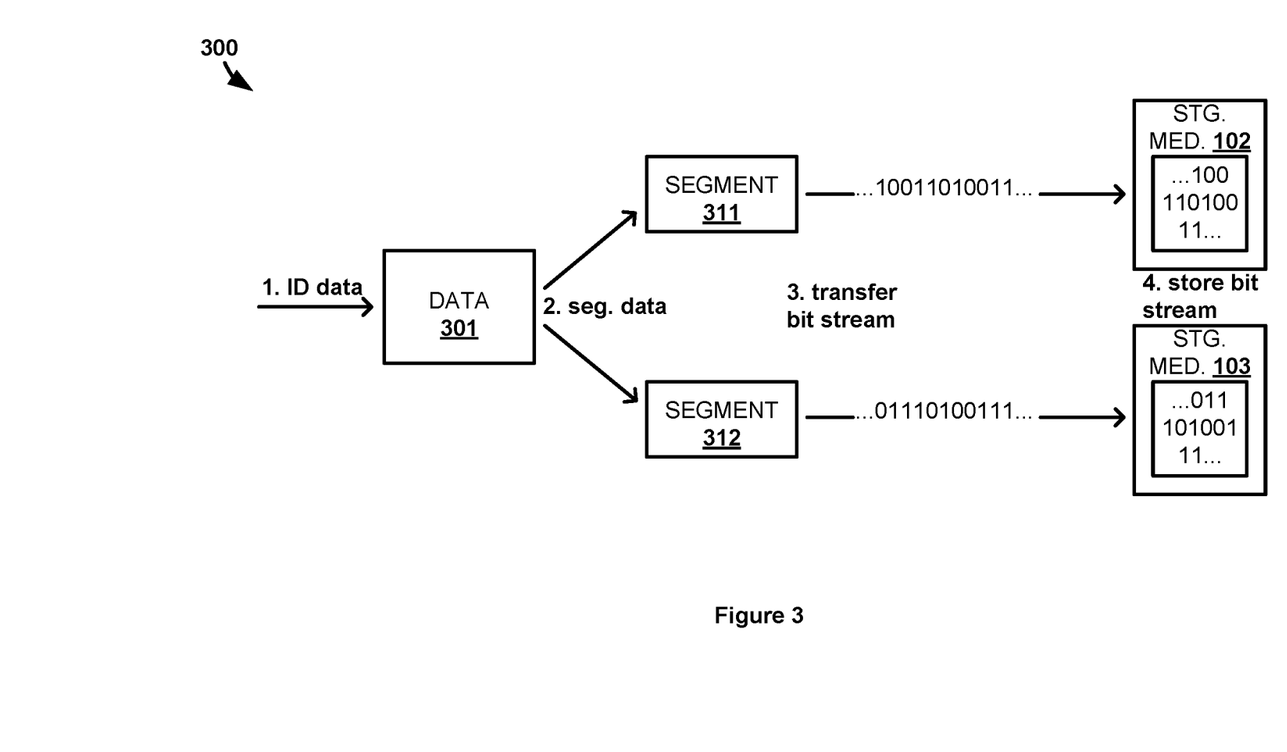
FIG. 3 illustrates an example scenario for operating the data storage environment to store data to a plurality of physical storage volumes.

FIG. 3 illustrates example scenario 300 for data storage environment 100 to store data across multiple physical data storage volumes. In scenario 300 at step 1, data write system 101 identifies data 301 as data to be written to physical data storage mediums 102 and 103. As noted above, there are many ways in which data 301 may be identified. Regardless of how data 301 is identified, upon obtaining the data, data write system 101 segments the data into two segments 311 and 312 at step 2. The number of segments is two in this example since there are two physical storage volumes upon which data 301 will be stored. Although, other examples may include additional storage volumes and data 301 would therefore be segmented into a number of segments corresponding to those additional storage volumes. As also noted above, the segments may be generated as part of a data protection process, such as erasure coding, a compression technique, such as chunking algorithms used by deduplication systems, or may be generated in some other manner.

At step 3, the segments are then transferred to physical data storage mediums 102 and 103 as bit streams over respective data channels. Upon receiving the respective bit streams of segments 311 and 312, physical data storage mediums 102 and 103 write the bit streams in the same condition they were received at step 4. That is, each received bit is written as is in the order in which it was received without any further processing, such as processing for error correction. Data storage environment 100 therefore relies on data write system 101 to perform any processing necessary for error correction without relying on the physical storage mediums in any way. In some cases, one or more redundant data write systems may be employed to avoid complications resulting from failure of data write system 101. The redundant data write systems may coordinate so that, should a first system fail, one of the other data write systems can continue where the failed system left off.

It should be understood and the entirety of data 301 need not be received in data write system 101 before moving onto subsequent steps. Rather, data 301 may be processed into segments each time a large enough portion of data 301 has been received for segmentation, the portion size dependent on the manner in which the data is segmented. Likewise, data write system 101 may begin to transfer data segments 311 and 312 to physical data storage mediums 102 and 103 before data segments 311 and 312 are completed. In a very basic example, data 301 may be segmented on a bit by bit basis wherein alternating bits of data 301 are sent to segments 311 and 312. Each bit may then be transferred to its respective physical storage medium right away rather than waiting for either data 301 to be completely received or for segment 311 or 312 to be completed from that received data 311.

Referring back to FIG. 1, data write system 101 comprises data processing circuitry and a physical storage volume interface. Data write system 101 may also include other components such as a user interface, router, server, data storage system, and power supply. Data write system 101 may reside in a single device or may be distributed across multiple devices. Data write system 101 may comprise a printed circuit board (PCB) having integrated circuits for performing as described herein, a personal computer, a server, or some other computing apparatus—including combinations thereof.

Physical data storage volumes 102 and 103 may be hard disk drives (HDDs), solid state drives (SSDs), or some other type of non-volatile memory apparatus. In some examples, physical data storage volumes 102 and 103 may be located in the same enclosure with data write system 101, although, other configurations may be used.

Communication links 111-112 uses metal, glass, air, space, or some other material as the transport media. Communication links 111-112 could use various communication protocols, such as Time Division Multiplexing (TDM), Internet Protocol (IP), Ethernet, SATA, communication signaling, Code Division Multiple Access (CDMA), Evolution Data Only (EVDO), Worldwide Interoperability for Microwave Access (WIMAX), Global System for Mobile Communication (GSM), Long Term Evolution (LTE), Wireless Fidelity (WIFI), High Speed Packet Access (HSPA), or some other communication format—including combinations thereof. Communication links 111-112 could be direct links or may include intermediate networks, systems, or devices.

Figure 4:
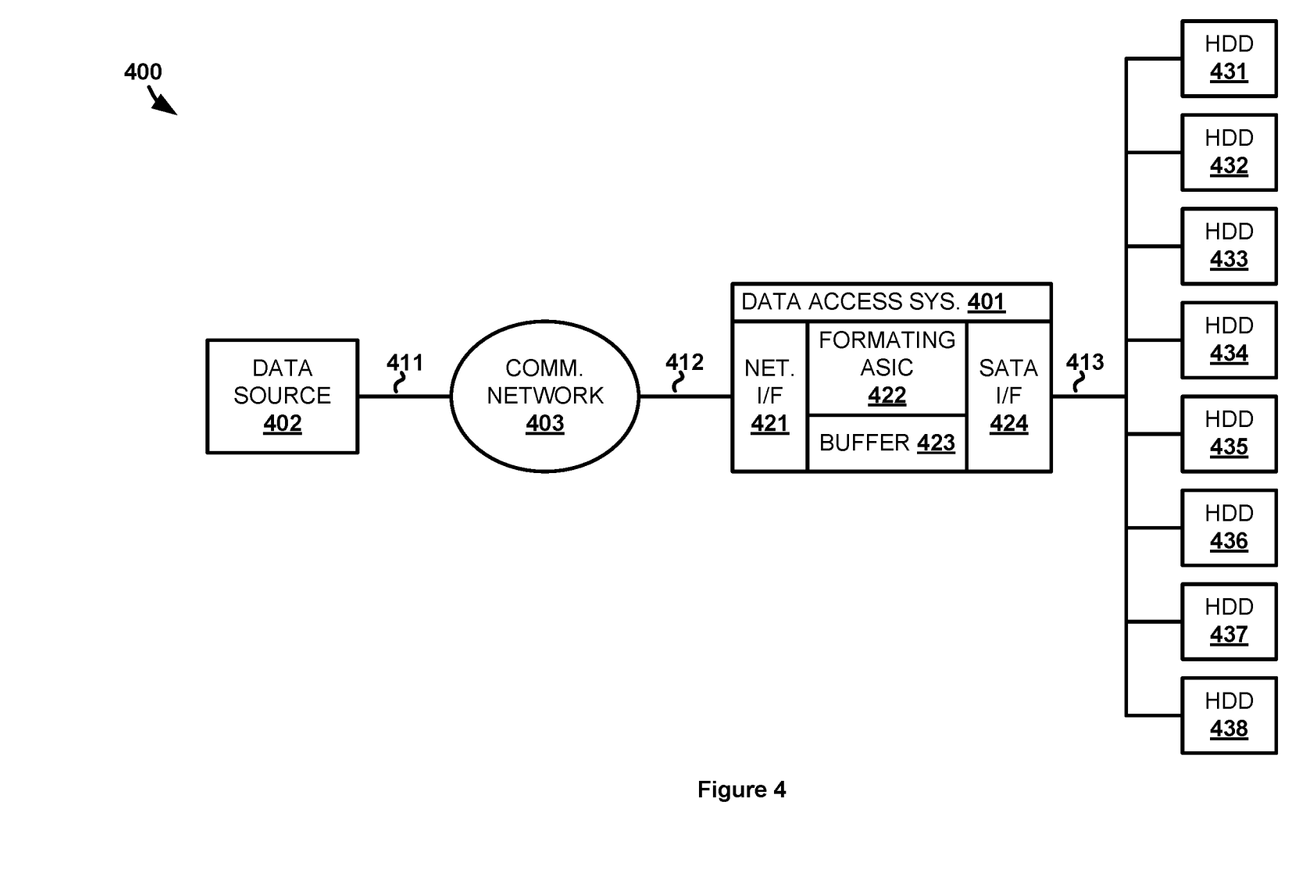
FIG. 4 illustrates another data storage environment for storing data to a plurality of physical storage volumes.

FIG. 4 illustrates data storage environment 400 for storing data across multiple physical data storage volumes. Data storage environment 400 includes data access system 401, data source 402, communication network 403, and hard disk drives (HDDs) 431-438. Data access system 401 and communication network 403 communicate over communication link 412. Data source 402 and communication network 403 communicate over communication link 411. Data access system 401 and HDDs 431-438 communicate over respective links 413 such as SATA.

Communication network 403 comprises network elements that provide communications services to at least data access system 401 and data source 402. Communication network 403 may comprise switches, wireless access nodes, Internet routers, network gateways, application servers, computer systems, communication links, or some other type of communication equipment—including combinations thereof. Communication network 403 may be a single network, such as a local area network, a wide area network, or the Internet, or may be a combination of multiple networks.

In operation, data access system 401 communicates with communication network 403 using network interface 421. In some examples, network interface 421 comprises a 10 Gigabit Ethernet (10 GbE) or faster interface with one or more ports depending on the desired connection speed. Formatting ASIC (Application Specific Integrated Circuit) 422 specifically designed to function as described herein. In some cases, formatting ASIC 422 may include one or more ARM processors or systems on chip (SoCs). Formatting ASIC 422 manages the data stored in buffer 423 ensure proper timing when exchanging data over communication network 403 and exchanging processed data with HDDs 431-438. SATA interface 424 is used by data access system 401 to exchange processed data over SATA links 413 with each SATA link corresponding to a data channel with each respective HDD 431-438. In some examples, data access system 401, rather than being a standalone system, may be compiled into a board within a larger system, which may include other data access system boards for writing to other HDD sets or other types of computing elements.

Each of HDDs 431-438 may use shingled magnetic recording to store data on platters therein, may use conventional perpendicular magnetic recording, or may use some other method of magnetic recording. HDDs 431-438 may include conventional processing circuitry that would normally be used to process data before writing that data to a magnetic platter. However, since the majority of that processing circuitry would go unused for the purposes of this disclosure, HDDs 431-438 may only include circuitry necessary to exchange bits with SATA interface 424 and write/read those bits to the platters of each respective HDD (e.g., servo control, motor control, read/write head control, etc.). The only other bits that would be writing to the platters by the HDDs would be timing and control bits required by the HDDs' low level format, which does not cause any modification to the data bits that are received from data access system 401. Essentially, HDDs 131-138 act like a track of a linear storage medium (e.g., magnetic tape). In this example, there are 8 HDDs that act as a single 8 track linear storage medium when written to by a single data access system 401. In other examples, more HDDs may be used to create even more "tracks" (e.g., 10, 16, 32, or any other number of HDDs) onto which data can be segmented. Additional HDDs may allow for more robust data protections schemes, which can segment the data into additional segments, and faster throughput when writing data to the HDDs.

Figure 5:
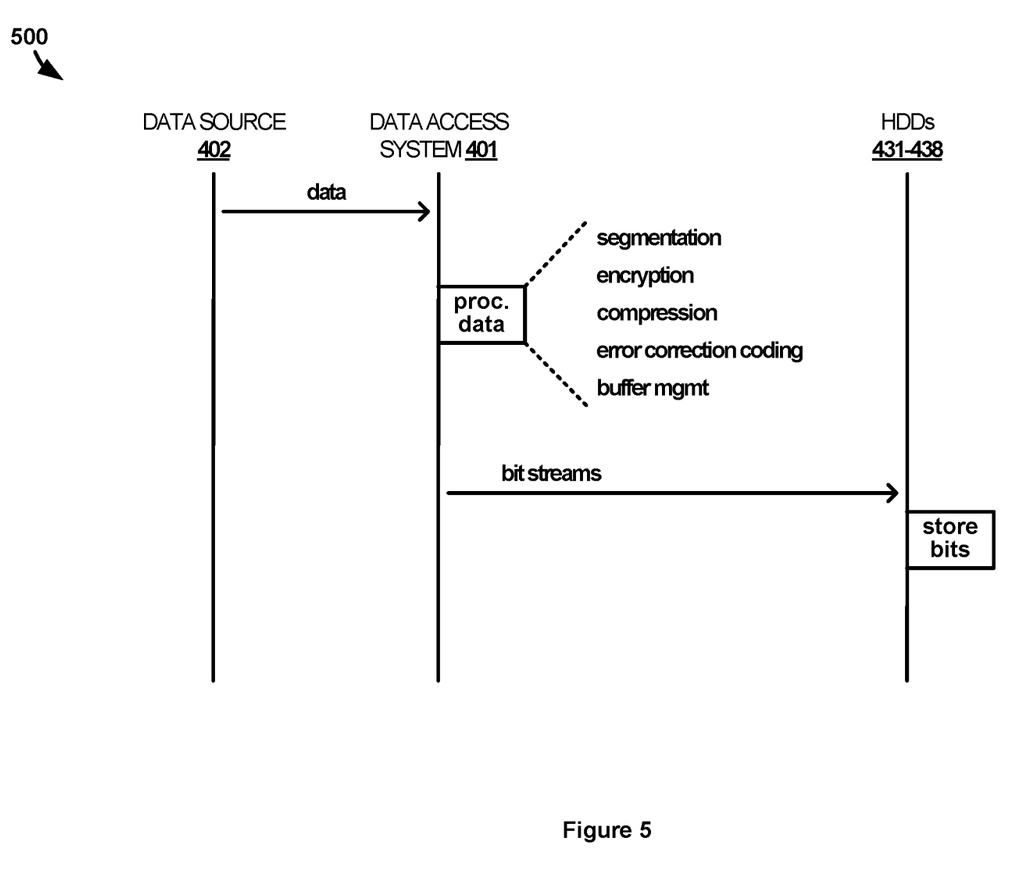
FIG. 5 illustrates an example scenario of the other data storage environment to store data to a plurality of physical storage volumes.

FIG. 5 illustrates scenario 500 in an example of operating data storage environment 400 to store data across multiple physical data storage volumes. In scenario 500, data access system 401 receives data to be written to HDDs 431-438 over communication network 403 from data source 402. In some examples, data source 402 may be a data backup system that transfers backup data of itself or other systems to data access system 401 for storage on HDDs 431-438.

However, the data received by data access system 401 may be received for any reason by any type of system. The data is received via network interface 421, although, in some examples, network interface 421 may be located apart from data access system 401 itself and the data may be received from that separate interface over a system bus or some other type of link.

As the data is received from data source 402, formatting ASIC 422 begins processing that data for storage on HDDs 431-438. The data may first be placed into buffer 423 from where formatting ASIC 422 accesses the data for processing. Once processed, the segmented data may be placed back into buffer 423 if it cannot be immediately streamed to HDDs 431-438. Operation 500 further illustrates possible processing functions that formatting ASIC 422 performs on the data. Specifically, the processing may include segmentation, encryption, compression, and error correction coding (e.g., erasure coding, cyclic redundancy check (CRC), etc.), in addition to the buffer management discussed above. Other types of processing may be performed on the data in other examples, such as deduplication. Also, some forms of processing may be an inherent result of another form. For instance, if erasure coding is performed on the data for forward error correction (FEC) before the data is stored, the data is broken up into segments during that erasure coding process. Those segments may then comprise the data written to each respective HDD 431-438 with or without further processing performed on the individual segments by formatting ASIC 422.

In one specific processing example, data access system 401 uses a dual layer, referred to as C1 and C2, orthogonal deeply interleaved error correction code. To do so, data access system 401 processes the data by splitting the data into 16 subsets (2 times the number of channels/HDDs) and then further segmenting the subsets into multiple code words. The code words are then encoded using a C2 Reed-Solomon (RS) error-correcting code. The code word symbols are orthogonally distributed from each of the subsets into code words that make up 8 files representing 8 segments to be transferred to each of HDDs 431-438. The code words in each file are then further protected using a C1 RS error-correcting code and interleaved before the files are transferred to HDDs 431-438.

Each segment of the processed data (or file in the case of the example immediately above) is then streamed via SATA interface 424 to each respective HDD 431-438 over a SATA data channel. The HDDs 431-438 each store the bits by writing each bit to disk without performing additional processing. As previously noted, if necessitated by the HDDs' low level format, HDDs 431-438 may also write timing and/or control bits but still does not process the bits received from data access system 401 in any way. In some cases, HDDs 431-438 may comprise identical drives (e.g., same model, size, manufacturer, etc.) that all begin use in data storage environment 400 in the same state (e.g., completely empty). When so configured, the platters and write heads may be synchronized across HDDs 431-438 for even faster writing and later access (i.e., when reading data as segments from HDDs 431-438 the segments for the desired data are all in the same physical locations on the HDDs).

Since HDDs 431-438 write only the bits sent to them from data access system 401, formatting ASIC 422 may further maintain a record of where the data was stored on HDDs 431-438 in order to find and read that data at a later time. The record may be stored locally in data access system 401, transferred to HDDs 431-438 for storage in a manner similar to that described for the data itself, or stored in some other location accessible by data access system 401.

Figure 6:
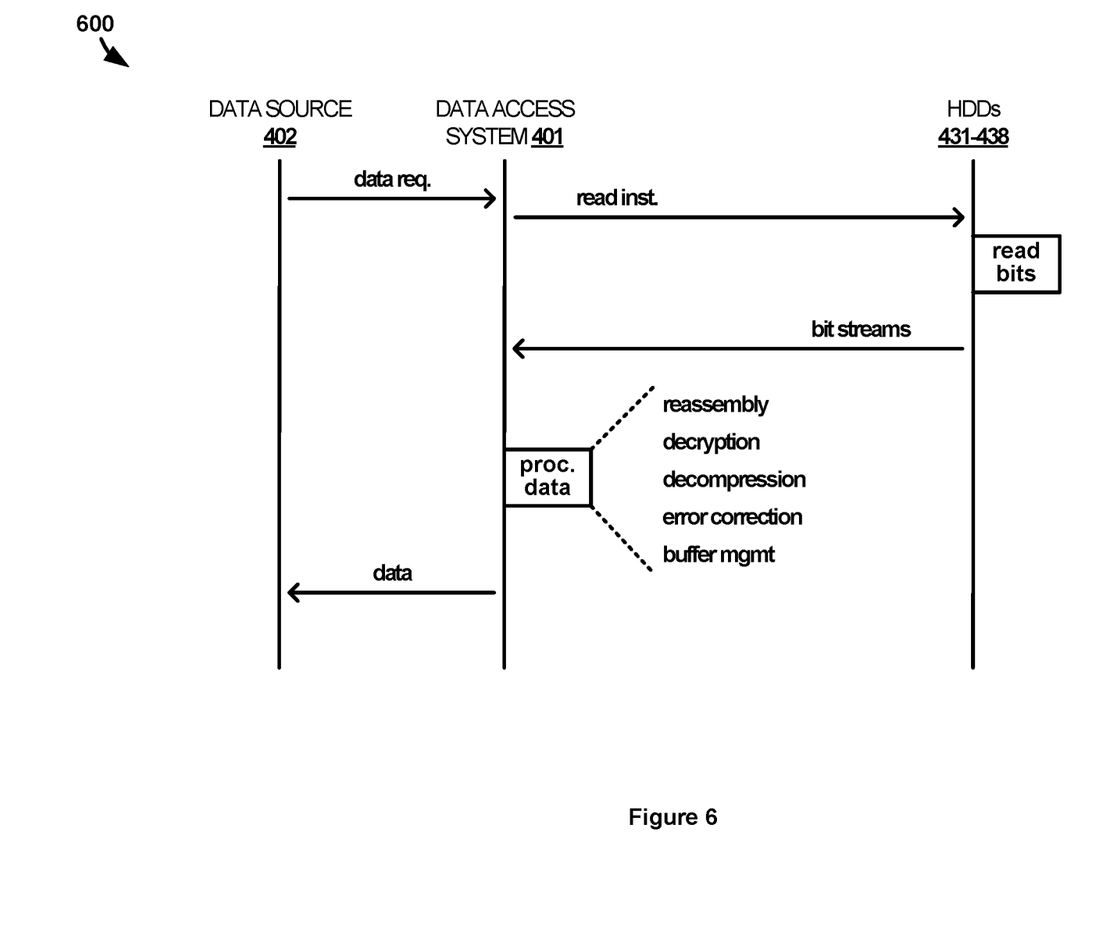
FIG. 6 illustrates another example scenario of the other data storage environment to read data stored to a plurality of physical storage volumes.

FIG. 6 illustrates scenario 600 in an example of operating data storage environment 400 to read data stored to a plurality of physical storage volumes. In scenario 600, data access system 401 receives, via network interface 421, a request for data stored in HDDs 431-438. The data may be any data stored to HDDs 431-438 in accordance with scenario 500 above. Data source 402 may be requesting the data for any reason. If, for example, data source 402 is a data backup system, data source 402 may be requesting the data in order to restore that data to its original location.

Regardless of the reason for requesting the data, data access system 401 instructs HDDs 431-438 over SATA interface 424 to read the respective segments of the request data stored thereon. In some cases, formatting ASIC 422 may read a record generated when storing the data to identify where on HDDs 431-438 the segments of the requested data are stored. Upon receiving the instructions, each respective HDD 431-438 reads the bits stored at the indicated locations and transfers those bits unaltered in a bit stream to data access system 401 over SATA interface 424. If HDDs 431-438 wrote any timing/control bits when writing the data segments, those timing/control bits are not included in the bit streams as the low level formatting of the HHDs does not read them as part of the data.

Formatting ASIC 422 then processes the received bit streams to reassemble the requested data. Formatting ASIC 422 may not receive the entirety of the bit streams before beginning to processing the received bits, rather, formatting ASIC 422 may begin processing the bits as soon as a requisite amount of bits are received for processing. Essentially, formatting ASIC 422 reverses the processing performed during scenario 500. That is, errors that may have occurred during the writing/reading process are corrected using whichever error correction scheme scenario 500 used. The data also may be decompressed, decrypted, or be processed in any other way necessary to reverse what was performed during scenario 500. The reassembled data is then transferred via network interface 421 to data source 402 in response to data source 102's request for the data.

Advantageously, the teachings of the above embodiments for storing data across multiple HDDs decreases the complexity of the overall data storage environment. Instead of needing processing hardware in each HDD for organization and error correction purposes, all such processing is performed in a centralized single processing unit (i.e., data access system 401). Moreover, the error correction techniques used by that single processing allows for lower bit error rates than would otherwise be allowed with a conventional server/HDD setup. For at least these reasons, the embodiments above provide for more efficient data storage across multiple HDDs.

Figure 7:
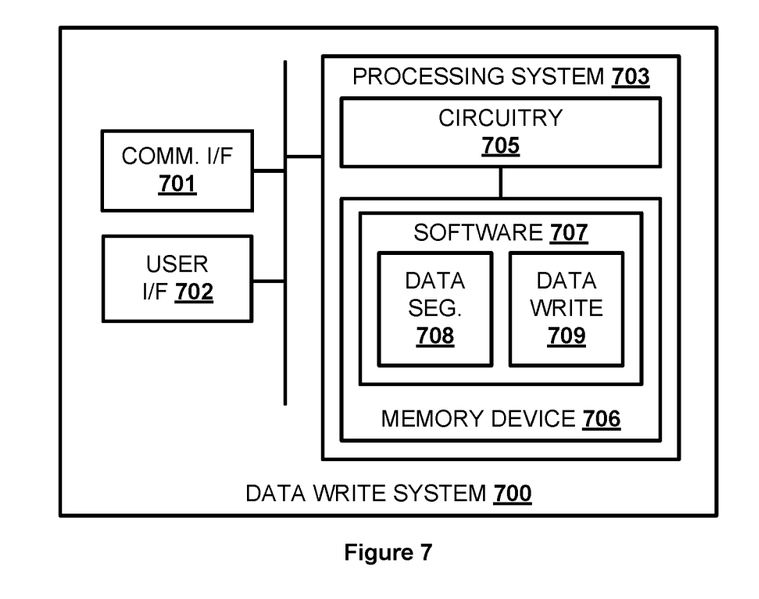
FIG. 7 illustrates a computing architecture for storing data to a plurality of physical storage volumes.

FIG. 7 illustrates data write system 700. Data write system 700 is an example of data write system 101, although system 101 may use alternative configurations, such as that shown for data access system 401. Data write system 700 comprises communication interface 701, user interface 702, and processing system 703. Processing system 703 is linked to communication interface 701 and user interface 702. Processing system 703 includes processing circuitry 705 and memory device 706 that stores operating software 707.

Communication interface 701 comprises components that communicate over communication links, such as network cards, ports, RF transceivers, processing circuitry and software, or some other communication devices. Communication interface 701 may be configured to communicate over metallic, wireless, or optical links. Communication interface 701 may be configured to use TDM, IP, Ethernet, SATA, optical networking, wireless protocols, communication signaling, or some other communication format—including combinations thereof.

User interface 702 comprises components that interact with a user. User interface 702 may include a keyboard, display screen, mouse, touch pad, or some other user input/output apparatus. User interface 702 may be omitted in some examples.

Processing circuitry 705 comprises microprocessor and other circuitry that retrieves and executes operating software 707 from memory device 706. Memory device 706 comprises a non-transitory storage medium, such as a disk drive, flash drive, data storage circuitry, or some other memory apparatus. Operating software 707 comprises computer programs, firmware, or some other form of machine-readable processing instructions. Operating software 707 includes data segmentation module 708 and data write module 709. Operating software 707 may further include an operating system, utilities, drivers, network interfaces, applications, or some other type of software. When executed by circuitry 705, operating software 707 directs processing system 703 to operate data write system 700 as described herein.

In particular, data segmentation module 708 directs processing system 703 to identify first data for storage on the plurality of physical storage volumes, wherein each of the plurality of storage volumes corresponds to respective ones of a plurality of data channels. Data segmentation module 708 further directs processing system 703 to segment the first data into a plurality of data segments corresponding to respective ones of the plurality of data channels. Data write module 709 directs processing system 703 to transfer the plurality of data segments as respective bit streams over the respective ones of the plurality of data channels to the respective ones of the plurality of physical storage volumes, wherein the plurality of storage volumes stores the respective bit streams in the exact condition in which the bit streams are received.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method of operating a system for storing data to a plurality of physical storage volumes, the method comprising:
    identifying first data for storage on the plurality of physical storage volumes, wherein each of the plurality of physical storage volumes corresponds to respective ones of a plurality of data channels;
    segmenting the first data into a plurality of data segments corresponding to respective ones of the plurality of data channels; and
    transferring the plurality of data segments as respective bit streams over the respective ones of the plurality of data channels to the respective ones of the plurality of physical storage volumes, wherein the plurality of physical storage volumes stores the respective bit streams in the exact condition in which the bit streams are received.

2. The method of claim 1, wherein the plurality of data segments comprises a plurality of files and wherein segmenting the first data comprises:
    splitting the first data into a plurality of subsets;
    splitting each subset of the plurality of subsets into a plurality of code words contained in the plurality of files.

3. The method of claim 2, wherein splitting each subset of the plurality of subsets into the plurality of code words comprises:
    orthogonally distributing symbols from each subset of the plurality of subsets into the plurality of code words to form the plurality of files.

4. The method of claim 3, further comprising:
    individually protecting each code word of the plurality of code words using a C1 error-correcting code; and
    interleaving the plurality of code words.

5. The method of claim 2, further comprising:
    encoding each code word of the plurality of code words using a C2 error-correcting code.

6. The method of claim 2, wherein the number of subsets in the plurality of subsets is equal to twice the number of data channels in the plurality of data channels.

7. The method of claim 1, performing the data protection process comprises:
    performing at least one of cyclic redundancy check (CRC), encryption, or compression on the first data.

8. The method of claim 1, wherein each of the plurality of channels comprises a Serial ATA (SATA) channel between the system for storing data and one of the plurality of physical storage volumes.

9. The method of claim 1, wherein the plurality of physical storage volumes comprises a plurality of hard disk drives, wherein the plurality of hard disk drives began writing the first data in a same state such that, when writing respective bits of the respective bit streams, platters and write heads of the plurality of hard disk drives are synchronized to write the respective bits in a same physical location across the plurality of hard disk drives.

10. The method of claim 1, wherein the plurality of physical storage volumes comprise a plurality of hard disk drives and each hard disk drive of the plurality of hard disk drives only writes control and timing bits in addition to writing the bit stream.

11. A system to store data to a data storage volume comprising a plurality of physical storage volumes, the system comprising:
    one or more computer readable storage media;
    a processing system operatively coupled with the one or more computer readable storage media;
    program instructions stored on the one or more computer readable storage media that, when read and executed by the processing system, direct the processing system to:
        identify first data for storage on the data storage volume, wherein each of the plurality of physical storage volumes corresponds to respective ones of a plurality of data channels;
        perform a data protection process on the first data that results in segmentation of the first data into a plurality of data segments corresponding to respective ones of the plurality of data channels; and
        transfer the plurality of data segments as respective bit streams over the respective ones of the plurality of data channels to respective ones of the plurality of physical storage volumes; and
    the plurality of physical storage volumes, wherein each physical storage volume of the plurality of storage volumes is configured to receive a respective bit stream of the bit streams and write the bits in the bit stream without modifying the bits from the condition in which the bits were received.

12. The system of claim 11, wherein the plurality of data segments comprises a plurality of files and wherein to perform the data protection process the program instructions direct the processing system to at least:
split the first data into a plurality of subsets;
split each subset of the plurality of subsets into a plurality of code words contained in the plurality of files.

13. The system of claim 12, wherein to split each subset of the plurality of subsets into the plurality of code words the program instructions direct the processing system to at least:
orthogonally distributing symbols from each subset of the plurality of subsets into the plurality of code words to form the plurality of files.

14. The system of claim 13, wherein the program instructions further direct the processing system to:
individually protect each code word of the plurality of code words using a C1 error-correcting code; and
interleave the plurality of code words.

15. The system of claim 12, wherein the program instructions further direct the processing system to:
encode each code word of the plurality of code words using a C2 error-correcting code.

16. The system of claim 12, wherein the number of subsets in the plurality of subsets is equal to twice the number of data channels in the plurality of data channels.

17. The system of claim 11, wherein to perform the data protection process the program instructions direct the processing system to:
perform at least one of cyclic redundancy check (CRC), encryption, or compression on the first data.

18. The system of claim 11, wherein each of the plurality of channels comprises a Serial ATA (SATA) channel between the system to store data and one of the plurality of physical storage volumes.

19. The system of claim 11, wherein the plurality of physical storage volumes comprises a plurality of hard disk drives, wherein the plurality of hard disk drives began writing the first data in a same state such that, when writing respective bits of the respective bit streams, platters and write heads of the plurality of hard disk drives are synchronized to write the respective bits in a same physical location across the plurality of hard disk drives.

20. The system of claim 11, wherein the plurality of physical storage volumes comprise a plurality of hard disk drives and each hard disk drive of the plurality of hard disk drives only writes control and timing bits in addition to writing the bit stream.

* * * * *

UNITED STATES PATENT AND TRADEMARK OFFICE
CERTIFICATE OF CORRECTION

PATENT NO. : 10,698,616 B2
APPLICATION NO. : 15/352475
DATED : June 30, 2020
INVENTOR(S) : Suayb S. Arslan, Turguy Goker and Jaewook Lee Page 1 of 1

It is certified that error appears in the above-identified patent and that said Letters Patent is hereby corrected as shown below:

In the Claims

Column 9 Lines 50-67 Replace all of Claim 1 with --A method of operating a system for storing data to a data storage volume comprising a plurality of physical storage volumes, the method comprising:
    in a data access system:
identifying first data for storage on the data storage volume, wherein each of the plurality of physical storage volumes corresponds to respective ones of a plurality of data channels;
performing a data protection process on the first data that results in segmentation of the first data into a plurality of data segments corresponding to respective ones of the plurality of data channels; and
transferring the plurality of data segments as respective bit streams over the respective ones of the plurality of data channels to respective ones of the plurality of physical storage volumes; and
at each physical storage volume of the plurality of storage volumes, receiving a respective bit stream of the bit streams and writing the bits in the bit stream without modifying the bits from the condition in which the bits were received.--

Column 10 Lines 1-7 Replace all of Claim 2 with --The method of claim 1, wherein the plurality of data segments comprises a plurality of files and wherein performing the data protection process comprises:
    splitting the first data into a plurality of subsets;
    splitting each subset of the plurality of subsets into a plurality of code words contained in the plurality of files.--

Signed and Sealed this
Fifth Day of October, 2021

Drew Hirshfeld
*Performing the Functions and Duties of the
Under Secretary of Commerce for Intellectual Property and
Director of the United States Patent and Trademark Office*